United States Patent
Mohamed Halick et al.

(10) Patent No.: US 11,287,465 B2
(45) Date of Patent: Mar. 29, 2022

(54) MONITORING AN OPERATING CONDITION OF A TRANSISTOR-BASED POWER CONVERTER

(71) Applicant: ROLLS-ROYCE plc, London (GB)

(72) Inventors: Mohamed Sathik Mohamed Halick, Derby (GB); Chandana J Gajanayake, Derby (GB); Sundararajan Prasanth, Derby (GB); Rejeki Simanjorang, Derby (GB); Amit K Gupta, Derby (GB)

(73) Assignee: ROLLS-ROYCE PLC, London (GB)

( * ) Notice: Subject to any disclaimer, the term of this patent is extended or adjusted under 35 U.S.C. 154(b) by 157 days.

(21) Appl. No.: 16/750,235

(22) Filed: Jan. 23, 2020

(65) Prior Publication Data

US 2020/0241067 A1    Jul. 30, 2020

(30) Foreign Application Priority Data

Jan. 30, 2019 (GB) ...................... 1901241

(51) Int. Cl.
*G01R 31/26* (2020.01)
*G01D 3/08* (2006.01)
(Continued)

(52) U.S. Cl.
CPC ........... *G01R 31/2621* (2013.01); *G01D 3/08* (2013.01); *G01R 31/2601* (2013.01);
(Continued)

(58) Field of Classification Search
CPC ........... G01R 31/2621; G01R 31/2884; G01R 31/275; G01R 31/2831; G01R 31/2642; G01R 31/2601; G01R 31/2617; G01R 31/42; G01R 31/27; H01L 2924/0002; H01L 2924/00; G01D 3/08; H02M 1/0054; Y02B 70/10; H03K 17/0828; H03K 17/689; H03K 17/78
(Continued)

(56) References Cited

U.S. PATENT DOCUMENTS 5,465,190 A   11/1995  Meunier et al.
6,400,581 B1   6/2002  Lee
(Continued)

OTHER PUBLICATIONS

May 29, 2020 extended Search Report issued in European Patent Application No. 20150209.3.
(Continued)

*Primary Examiner* — Raul J Rios Russo
(74) *Attorney, Agent, or Firm* — Oliff PLC (57) ABSTRACT

An operating condition monitor (100) for monitoring an operating condition of a transistor-based power converter (102), comprising: a sensing apparatus (106) configured to measure a turn-off transient energy of the power converter (102), a processor (108) in communication with the sensing apparatus (106) to receive the measurement of the turn-off transient energy, the processor being configured to: compare the measurement of the turn-off transient energy to a threshold; and issue an event signal based on the comparison to the threshold meeting a comparison criterion. A method (200, 200') of monitoring an operating state of a transistor-based power converter is also disclosed.

20 Claims, 8 Drawing Sheets

(51) Int. Cl.
*G01R 31/42* (2006.01)
*G01R 31/27* (2006.01)
*H02M 1/00* (2006.01)
*H03K 17/082* (2006.01)
*H03K 17/689* (2006.01)
*H03K 17/78* (2006.01)

(52) U.S. Cl.
CPC ..... *G01R 31/2617* (2013.01); *G01R 31/2642* (2013.01); *G01R 31/27* (2013.01); *G01R 31/42* (2013.01); *H02M 1/0054* (2021.05); *H03K 17/0828* (2013.01); *H03K 17/689* (2013.01); *H03K 17/78* (2013.01); *Y02B 70/10* (2013.01)

(58) Field of Classification Search
USPC ......... 324/71, 378, 403, 415, 425, 500, 537, 324/762.01, 762.09
See application file for complete search history.

(56) References Cited

U.S. PATENT DOCUMENTS

| | | |
|---|---|---|
| 7,421,353 B1 | 9/2008 | Pace |
| 8,103,463 B2 | 1/2012 | Kalgren et al. |
| 2008/0094866 A1 | 4/2008 | Bauman et al. |
| 2008/0130322 A1* | 6/2008 | Artusi ................ H02M 1/4225 363/21.01 |
| 2009/0206059 A1* | 8/2009 | Kiko ...................... H01H 47/22 218/143 |
| 2010/0165667 A1* | 7/2010 | Artusi ................ H02M 1/4225 363/21.01 |
| 2015/0012145 A1* | 1/2015 | Kiko ................ H02J 13/00036 700/291 |
| 2020/0028386 A1* | 1/2020 | Sexton .................... H02J 50/10 |
| 2020/0274375 A1* | 8/2020 | Griffiths ................ H02J 7/1423 |

OTHER PUBLICATIONS

Smet, V. et al., "Evaluation of Vee Monitoring as a Real-Time Method to Estimate Aging of Bond Wire-IGBT Modules Stressed by Power Cycling," IEEE Transactions on Industrial Electronics, vol. 60, No. 7, Jul. 2013, pp. 2760-2770.

Coquery, G. et al., "Failure Criteria for Long Term Accelerated Power Cycling Test Linked to Electrical Turn Off SOA on IGBT module. A 4000 Hours Test on 1200A-3300V Module with AlSiC Base Plate.," Microelectronics Reliability, vol. 40, 2000, pp. 1665-1670.

Search Report of the Intellectual Property Office of the United Kingdom for GB1901241.8 with search date of Jul. 22, 2019.

Brown, D., Abbas, M., Ginart, A., Ali, L, Kalgren, P., Vachtsevanos, G., 'Turn-off Time as a Precursor for Gate Bipolar Transistor Latch-up Faults in Electric Motor Drives', 2010, Annual Conference of the Prognostics and Health Management Society of 2010, pp. 1-8.

\* cited by examiner

MONITORING AN OPERATING CONDITION OF A TRANSISTOR-BASED POWER CONVERTER

CROSS-REFERENCE TO RELATED APPLICATIONS

This application claims the benefit of United Kingdom Patent Application No. GB 1901241.8 filed on Jan. 30, 2019, the disclosure of which is herein incorporated in its entirety.

TECHNICAL FIELD

This disclosure relates to an operating condition monitor for monitoring an operating condition of a transistor-based power converter. The disclosure also relates to a method of monitoring an operating condition of a transistor-based power converter. The power converter may be any transistor-based device used to provide a conversion of electric power.

BACKGROUND

Power semiconductor devices have gained a leading position in renewable energy, aerospace and marine applications. However, due to the fact that the power semiconductor devices are exposed to electrical, thermal and mechanical stresses, the failure rates of these components are comparatively high, and this was found to be the main reason for reducing the reliability of the whole system. Therefore, the reliability of semiconductor power devices or transistors is one of the key concerns in power converters, especially in safety mission critical applications. Many efforts have been dedicated to reducing wear-out failures such as bond-wire lift off caused by solder die degradation induced due to device ageing caused by a mismatch in coefficients of thermal expansion (CTE). This thermal mismatch related degradation is mainly because of temperature swings either from operating condition (active power cycling) or due to environmental conditions (passive temperature cycling).

It is estimated that about 38 percent of the faults in variable speed drive systems are due to failure of power devices or transistors. Inverter failure is critical, especially in aircraft and marine applications. These applications usually require proper thermal management systems to ensure the protection of power devices or transistors from thermal runaway failure. Regardless of the extensive efforts to improve the reliability of power semiconductor devices, failure of power electronics has been witnessed continuously. Although power semiconductors are rugged, they suffer from failures due to electrical and thermal stresses that happen in many applications, especially since many power converters are continuously operated with highly inductive loads with varying operating currents. Moreover, their operating conditions can be more adverse when system thermal management is not optimal, and this will eventually trigger power module wear out failures. Therefore, in safety critical applications a premature failure could lead to a complete system shutdown and so reduces the reliability of whole systems.

One solution to address this problem is to perform active health monitoring for early diagnosis of potential failure to increase the reliability and conduct lifetime estimation of power converters through suitable prognostic methodologies. This is of special interest in mission critical applications such as avionics, marine, high-speed rail and wind turbines, where no failure is permissible until the next scheduled maintenance period.

In general, health monitoring approaches involve monitoring of appropriate parameters that are indicative of impending failures. The failure precursor parameter is a sign of an event or series of occurrences that indicate the ageing or forthcoming failure of a device. Detecting ageing or failure of a power semiconductor device is more challenging because most of the existing techniques are able to identify failure mechanisms at a final stage rather than at an incipient stage. Moreover, most of the existing techniques are unsuitable for use with an off-the-shelf power converter, since they require custom modification of the components of the device itself.

Several failure precursor parameter-based methods are known for monitoring power device or transistor potential failures caused by degradation or ageing.

Smet et al (V. Smet, F. Forest, J.-J. Huselstein, A. Rashed, and F. Richardeau, "Evaluation of monitoring as a real-time method to estimate aging of bond wire-IGBT modules stressed by power cycling," *IEEE Transactions on Industrial Electronics*, vol. 60, pp. 2760-2770, 2013.) discloses power cycling tests and investigation of device on-state voltage ($V_{CE,on}$) response using eight IGBT samples with respect to thermal over stress. Smet et al reported that the device on-state voltage ($V_{CE,on}$) of an aged power device or transistor increased almost 5 to 8 percent compared to post ageing (shown in FIG. 1 of Smet et al). This change was attributed to the wear-out failure of the power semiconductor devices. The application of $V_{CE,on}$ to monitoring power converter failure is challenging. This is mainly due to variation of the on-state voltage during the degradation being overwhelmed by signal noise or disturbances in the switching leading to the false identifications. Moreover, this technique requires measuring at high voltage such that voltage clamping is required to measure the voltage accurately. The degradation behaviour of a diode may also influence the measurement, and it is difficult to decouple such a parameter variation from the measurement.

Repetitive thermo-mechanical stress may cause cracks in solder layers. These cracks shrink the effective area of heat dissipation in the silicon die to the heat sink. As a consequence, thermal resistance of an IGBT module increases. This will eventually give rise to increased junction temperature of the device and finally lead to thermal runaway or secondary breakdown. Direct measurement of solder cracks or solder fatigue is difficult during device operation. Thermal resistance ($R_{th}$) based techniques can be suitable for monitoring solder fatigue failure in a power converter. Coquery et al (G. Coquery and R. Lallemand, "Failure criteria for long term Accelerated Power Cycling Test linked to electrical turn off SOA on IGBT module. A 4000 hours test on 1200 A-3300V module with AlSiC base plate," *Microelectronics reliability*, vol. 40, pp. 1665-1670, 2000) conducted a power cycling test for 4000 hours and simultaneously monitored the thermal resistance ($R_{th}$) variation with respect to degradation. The results show that the value of thermal resistance ($R_{th}$) was increased to 20 percent from its initial value.

Estimation of thermal resistance requires junction temperature and power dissipation information. It is challenging to obtain the junction temperature information, which is not easily directly measurable. Therefore, it is important to estimate the junction temperature of the power device or transistor accurately. The most common method to estimate junction temperature of the power device or transistor is an electro-thermal parameter approach. In this approach (i.e.

that of G. Coquery et al) device electrical parameters such as on-state voltage, on-state resistance and gate threshold voltage information are used to extract junction temperature of a power device or transistor. However, these parameters are influenced by device ageing. Hence, accurate estimation of temperature is difficult and thermal resistance is difficult to use as a potential parameter to define the ageing of a power converter.

U.S. Pat. No. 8,103,463 discloses an approach based on analysis of switching behaviour which utilizes the changes in ringing behaviour during the commutation period of a power module. This requires measuring the voltage or current in the high voltage side of the inverter and use of a bandpass filter to extract the high frequency ringing component. This method relies on the fact that there is an increase in the damping co-efficient and attenuation in high frequency ringing of the voltage and current waveform in an aged power converter.

SUMMARY

The invention is directed to operating condition monitors and methods for monitoring an operating condition of a transistor-based power converter One such operating condition monitor comprises:

a sensing apparatus configured to measure a turn-off transient energy of the power converter, a processor in communication with the sensing apparatus to receive the measurement of the turn-off transient energy, the processor being configured to:

compare the measurement of the turn-off transient energy to a threshold; and issue an event signal based on the comparison to the threshold meeting a comparison criterion.

One such method comprises:

measuring a turn-off transient energy of the power converter; comparing the measurement of the turn-off transient energy to a threshold;

issuing an event signal based on the comparison meeting a comparison criterion

BRIEF DESCRIPTION OF THE DRAWINGS

Embodiments will now be described by way of example only with reference to the accompanying drawings, which are purely schematic and not to scale, and in which.

DETAILED DESCRIPTION

Figure 1:
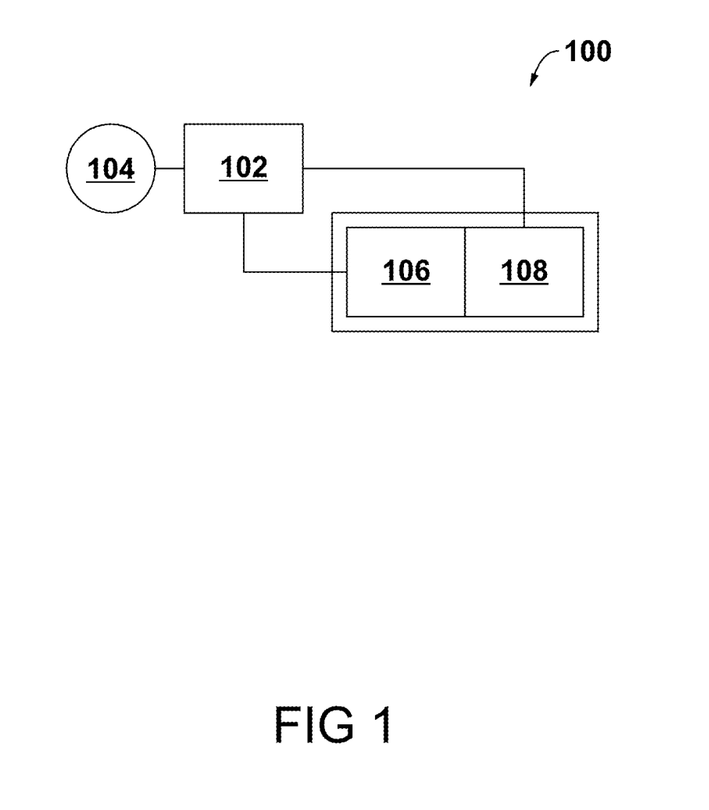
FIG. 1 is a schematic of an operating condition monitor and a transistor-based power converter according to an embodiment.

An operating condition monitor 100 for monitoring an operating condition of a transistor-based power converter 102 is illustrated schematically in FIG. 1.

The transistor-based power converter 102 that is monitored may be any power converter that employs one or more transistor components to provide a conversion of electrical power. In the present embodiment, the power converter is a three-phase AC-AC converter as will be described further with reference to FIG. 2A and FIG. 2B. The transistors provided in the power converter may be any type known in the art such as IGBT, MOSFET, SiCMOSFET or GaN semiconductor devices. The power converter may be used to provide or receive electrical power from a load 104. In other embodiments, the power converter may be, for example, an AC to DC rectifier, a DC to AC inverter or a DC to DC converter. The load may be, for example, an AC or DC motor or generator. The operating condition monitor 100 may however be used to monitor any type of transistor-based power converter and is not limited to the examples described herein.

The operating condition monitor 100 comprises a sensing apparatus 106 and a processor 108. The sensing apparatus is configured to measure a turn-off transient energy of the power converter 102. The sensing apparatus 106 may comprise sensors external to the power converter 102 that are configured to provide measurements from which the turn-off transient energy can be derived. The measurement of the turn-off transient energy may be derived from measurements of a turn-off transient voltage and turn-off transient current as will be described later. Other methods of measuring or obtaining the turn-off transient energy are however possible. For example, a high-bandwidth current and voltage sensor may be used to estimate the switching energy of the power converter.

The processor 108 is in communication with the sensing apparatus 106 to receive the measurement of the turn-off transient energy that has been measured by the sensor 106. In the present embodiment, a measurement of the turn-off transient energy rather than the actual turn-off transient energy itself is received by the processor.

The processor 108 is further configured to compare the measurement of the turn-off transient energy to a threshold. The processor is also configured to issue an event signal based on the comparison of the measurement of the turn-off transient energy to the threshold meeting a comparison criterion. The comparison criterion may be that the measurement of the turn-off transient meets or exceeds the threshold. The event signal may indicate that the operating condition of the power converter 102 has changed, and so may act to indicate a degradation of the power converter 102.

The operating condition monitor 100 uses a measurement of the turn-off switching energy of a transistor-based power converter as a precursor to detect a degradation and potential failure of the device. A change in turn-off transient energy may provide an indication of bond wire lift-off due to solder die degradation within a transistor of the power converter. This degradation is otherwise difficult to detect during operation of the device. By detecting the change in turn-off switching energy an improved health monitoring and remaining useful life (RUL) estimation may be provided. Other forms of degradation of the power converter may also be detected by measurement of a change in turn-off switching energy and the condition monitor is not limited to detecting only this type of degradation.

The processor 108 may be configured to obtain a normalised measurement of the turn-off transient energy by normalising the measurement of the turn-off transient energy that is measured by the sensing apparatus 106. In such an embodiment, the processor 108 is configured to compare the normalised measurement of the turn-off transient energy to the threshold. The normalisation may be carried out with respect to an operating parameter of the power converter 102. By normalising the measurement of the turn-off transient energy, the effect of a change in operating condition on the turn-off transient energy can be distinguished from a change resulting from other factors (e.g. by a change in an operating parameter such as the magnitude of the voltage or current being converted). The normalisation may therefore help to provide an accurate measurement of the operating condition compared to using the raw measured turn-off transient energy values.

In some embodiments, no normalisation of the turn-off transient energy measurement is required. This may be the case, for example, where the threshold to which the turn-off transient energy measurement is compared is based on other parts of the power converter as will be described later. If comparing different parts of the same power converter the normalisation may not be needed as those parts are likely to be operating in similar conditions. The normalisation may however still be used in such an embodiment.

Figure 2A:
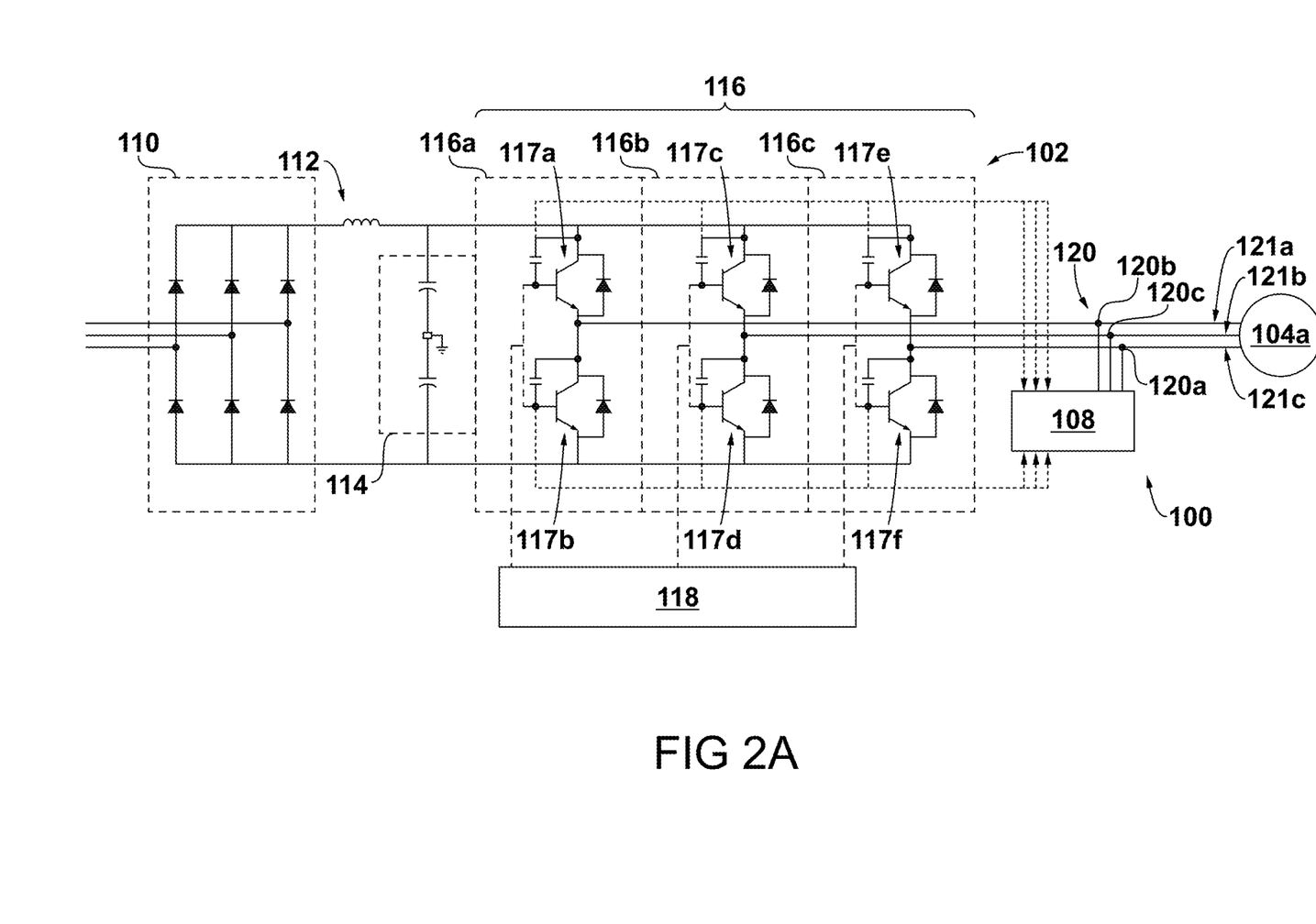
FIG. 2A is a schematic of an operating condition monitor and a transistor-based power converter according to an embodiment.
Figure 2B:
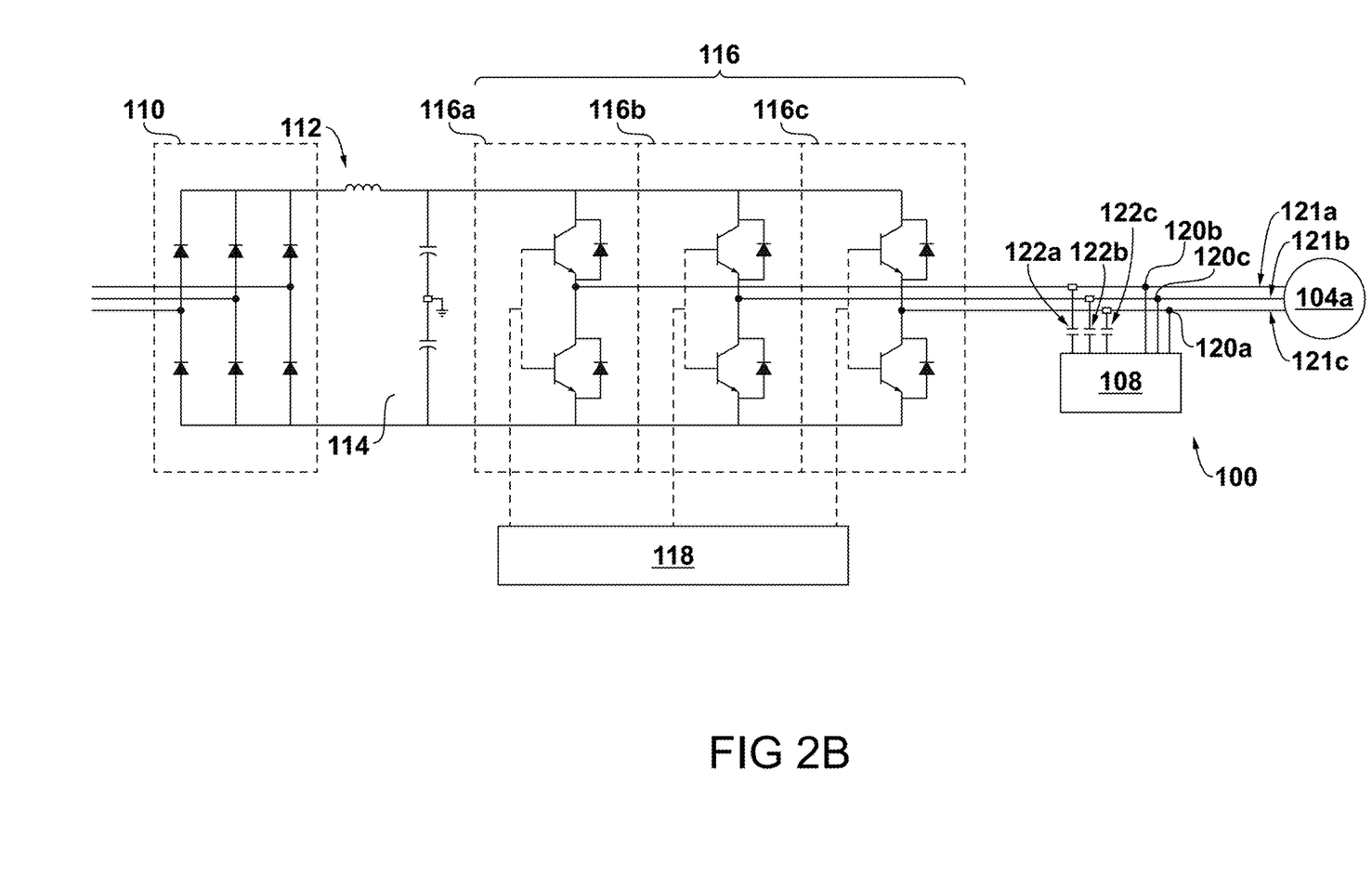
FIG. 2B is a schematic of another embodiment of an operating condition monitor and a transistor-based power converter according to an embodiment.

FIGS. 2A and 2B illustrate embodiments in which the operating condition monitor 100 measures the turn-off transient energy of one or more separate parts of the power converter 102. The one or more separate parts of the power converter may include separate power devices (e.g. transistors) or separate phase legs of the power converter as will be described in more detail as follows.

An embodiment of the operating condition monitor 100 is shown in more detail in FIG. 2A.

In the embodiment illustrated in FIG. 2A, the power converter 102 is a three-phase AC-AC converter coupled to a load in the form of a motor 104a. The power converter 102 comprises a rectifier 110, an inductor 112, a DC capacitor link 114 and an inverter 116 configured to provide an AC-AC conversion in a conventional way.

In this example, the rectifier receives a three-phase AC input and the inverter comprises six phase legs 116a, 116b, 116c. Each phase leg 116a, 116b, 116c comprises two power devices 117a, 117b, 117c, 117d, 117e, 117f each comprising a transistor. The power converter 102 may further comprise a controller 118. The controller may be a gate driver arranged to control operation of each of the phase legs 116a, 116b, 116c of the inverter to provide control of the device output.

In order to measure a turn-off transient energy, the sensor 106 may comprise a transient turn-off current sensor and a transient turn-off voltage sensor. In the embodiment shown in FIG. 2A, the sensing apparatus is arranged to measure a transient turn-off energy of each power device (e.g. each transistor) 117a, 117b, 117c, 117d, 117e, and 117f respectively. The sensing apparatus 106 comprises a transient current sensor 120 coupled to each phase leg output 121a, 121b, and 121c of the power converter. In this embodiment, the transient current sensor 120 comprises a plurality of Rogowski coils 120a, 120b, 120c each connected to a respective one of the phase leg outputs. The sensing apparatus 106 further comprises a transient voltage sensor 122. The transient voltage sensor 122 comprises a plurality of Miller capacitors (each labelled Cm in FIG. 2A) that are each coupled between the respective gate and collector of the each of the power devices (e.g. transistors) 117a, 117b, 117c, 117d, 117e, and 117f. In another embodiment, the sensing apparatus may be arranged to measure the transient turn-off energy of any one or more of the power devices 117a-117f rather than all of the power devices 117a-117f as shown in FIG. 2B. The power devices 117a-117f each form a part of the power converter that is monitored by the operating condition monitor.

The measurement of the turn-off transient energy may be normalised based on various different system operating conditions of the power converter 102. The normalisation may be with respect to a junction temperature of a transistor of the power converter 102 (e.g. a junction temperature of one of transistors of power devices 117a, 117b, 117c, 117d, 117e, and 117f of the inverter shown in FIG. 2A). Other system operating conditions may be used. For example, the normalisation may be based on the operating current and/or the operating voltage. Even though variation of turn-off switching energy with respect to junction temperature is relatively less compared to other operating parameters, it may still provide an advantageous reference with respect to which normalisation may be performed and may help to identify early sign of device degradation and failures.

The operating condition of the power converter may be measured or obtained from in-build sensors, which provide measurement of system voltage, ambient temperature, and load current information. The controller may access these signals and normalize the measured switching energy accordingly.

By normalising the measurement of the turn-off transient energy in this way the overall accuracy of the operating condition monitor 102 may be improved, which may help to identify early signs of device degradation and failures.

In order to issue an event signal, the processor 108 is configured to compare the normalised measurement of the turn-off transient energy to a threshold to determine if a comparison criterion is met. If the normalised measurement of the turn-off transient energy meets or exceeds the threshold, the performance indicator signal may be issued to indicate that device degradation has occurred. The threshold used for the comparison may be a stored reference value that is accessible by the processor 108 (e.g. either in a local or remote memory or other storage). The stored reference value may be stored in a look up table. The stored reference value may be a previous measurement of the turn-off transient energy during operation in which little or no device degradation has occurred. In other embodiments, the reference value may be an expected value determined based on a simulation or model of the operation of the power converter 102 when little or no degradation has occurred.

In other embodiments, normalised or non-normalised measurements of the turn-off transient energy of the power devices (e.g. each transistor) provided in the power converter may be measured and compared rather than performing a comparison to a stored reference value. This will be described in more detail later.

Another embodiment of the operating condition monitor 100 is shown in FIG. 2B. The power converter shown in FIG. 2B includes features corresponding to those of that shown in FIG. 2A and which are given the same reference numerals. In this example the separate phase legs 116a, 116b, 116c of the power converter are monitored separately. The phase legs 116a, 116b, 116c therefore each form a part of the power converter that is monitored by the operating condition monitor. In this embodiment, the sensing apparatus comprises a plurality of sensors to monitor each phase leg of the power converter. In the embodiment of FIG. 2B, the sensing apparatus 106 comprises first, second and third transient turn-off current sensors 120a, 120b, 120c. Each transient turn-off current sensor is arranged to measure the transient current at the output of each of the phase legs 116a, 116b, 116c. In order to measure the transient current, each of the current sensors 120a, 120b, 120c may comprise a Rogowski coil as described herein with respect to other embodiments. Other types of current sensor may however be used.

The sensing apparatus 106 also comprises first, second and third transient turn-off voltage sensors 122a, 122b, 122c. Each transient turn-off voltage sensor is arranged to measure the transient switching voltage at the output of each of the phase legs 116a, 116b, 116c. In order to measure the transient voltage, each of the voltage sensors 122a, 122b, 122c may comprise a collector capacitor. Each collector capacitor is coupled to the output of each phase leg as shown in FIG. 2B. Other types of voltage sensor may however be used. In the embodiment shown in FIG. 2B, the sensing apparatus is arranged to measure the turn-off transient voltage of each of the phase legs 116a, 116b, 116c of the power converter. In other embodiments, only one or more of the phase legs may be monitored.

In either of the embodiments of FIGS. 2A and 2B the processor 108 may be configured to normalise the measurement of the turn-off transient energy of each of the plurality of parts of the power converter being monitored (e.g. each power device 117a-117f or each phase leg 116a-116c) with respect to an operating parameter of that respective part of the power converter.

The processor may then be configured to compare the normalised turn-off transient energy measurement to the threshold by performing a comparison of the normalised turn-off transient energy measurement of one of the parts of the power converter to the normalised measurement of the turn-off transient energy of another of the parts of the power converter. The threshold is therefore the normalised measurement of the turn-off transient energy for another of the parts of the power converter. This may allow a comparison between devices (e.g. between different phase legs and between different transistors), rather than a comparison to a reference value.

In some embodiments, the processor may be configured to perform a comparison of the normalised measurement of the turn-off transient energy of one of the parts of the power converter to an average normalised measurement of the turn-off transient energy of the plurality of parts of the power converter. The threshold is therefore the average normalised measurement of the turn-off transient energy over the plurality of the parts of the power converter. This may allow the deviation of the measurement of the turn-off transient energy from average to be found, which may provide an indication that degradation of that particular transistor device or phase leg has occurred.

In yet other embodiments, the processor 108 may be configured to perform a comparison of the normalised measurement of the turn-off transient energy of each of the plurality of parts of the power converter to the average normalised measurement of the turn-off transient energy.

The processor 108 may further be configured to identify one of the parts of the power converter having the greatest deviation from the threshold (i.e. the greatest deviation from the average value between them). This may allow the processor 108 to identify the weakest part in the system. This may help to identify failure conditions much earlier that enable condition-based control and to identify the components that require maintenance from those that do not. An identifier may be included in the event signal to identify which of the plurality of parts of the power converter has been identified as the weakest so that it can be replaced or repaired.

In some embodiments, the measurement of the turn-off transient energy may not be normalised as described above. For example, in embodiments where the measurement of the turn-off transient energy of part of the power converter is compared to a measurement of the turn-off transient energy of another part of the power converter or compared to an average the normalisation may be omitted. In that case, the different parts of the power converter may operate under similar conditions so that normalisation may not be required.

In some embodiments, the processor 108 may be arranged to output the event signal to a suitable display or other output device so that an operator may take appropriate action based on the indication that degradation may have occurred. In other embodiments, the processor 108 may be arranged to output the event signal to the controller 118. In this embodiment, the controller 118 may be arranged to modify an operating parameter of the power converter 102 based on the event signal. The operating parameter modified may include any one or more of a junction temperature of a transistor of the power converter 102, or an operating voltage or current of the power converter or a part thereof. In embodiments where the weakest part of the power converter 102 is identified, the processor may be configured to output a control signal to modify an operating parameter of the identified part of the power converter. The controller may, for example, be arranged to deactivate the identified part of the power converter and activate a redundant or back-up part of the power converter. The redundant part may comprise a redundant phase leg that is included in parallel with the phase legs used for normal operation. In other embodiments, the redundant part may comprise a redundant inverter that is included in the power converter along with the inverter of the described embodiments.

In some embodiments, the processor may be configured to determine a remaining lifetime (RUL) parameter of the power converter 102. The RUL parameter may be determined based on variations in the turn-off transient energy from pre-defined threshold values. This may be done using a Kalman filter. Other methods may however be used.

Figure 3A:
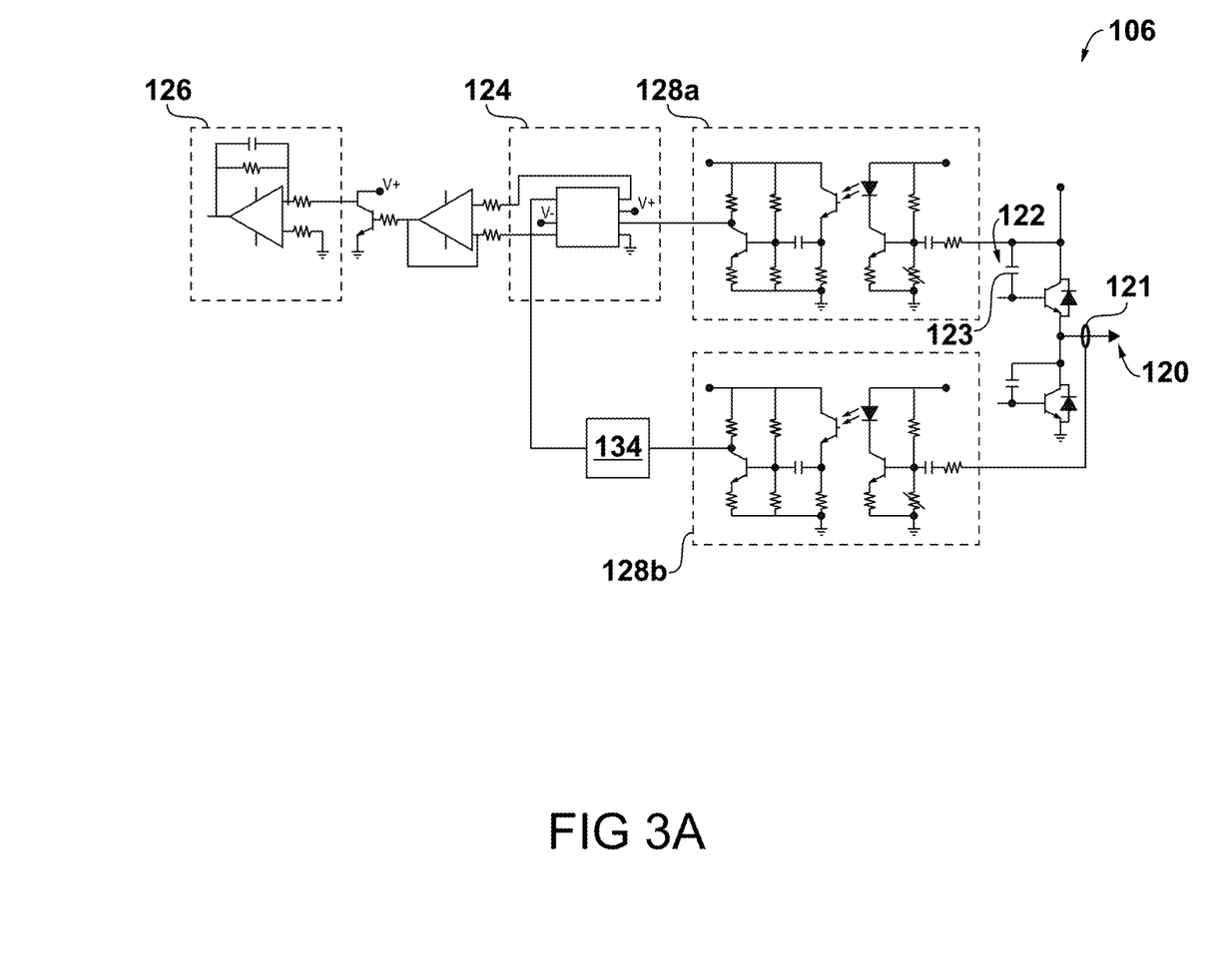
FIG. 3A is a schematic of a sensing apparatus of the operating condition monitor shown in FIG. 2A.
Figure 3B:
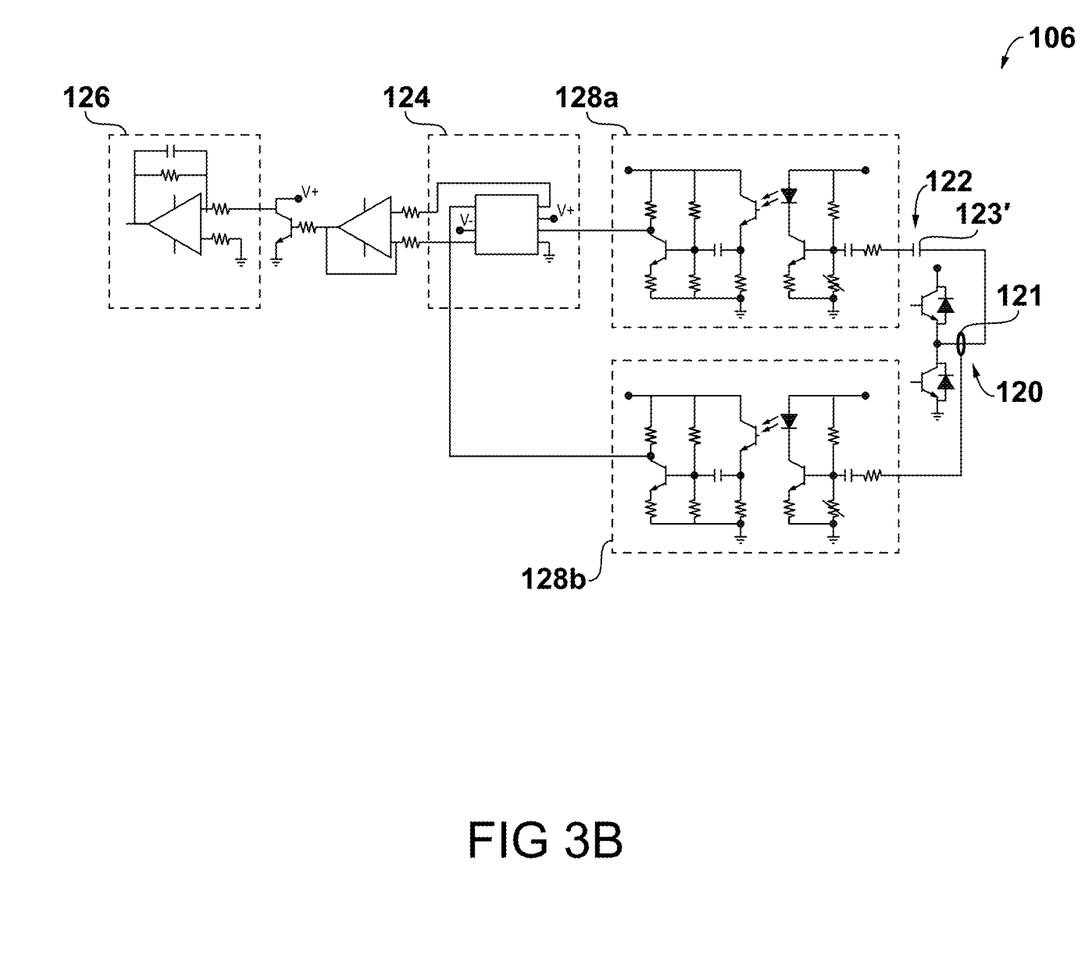
FIG. 3B is a schematic of a sensing apparatus of the operating condition monitor shown in FIG. 2B.

FIGS. 3A and 3B illustrate embodiments of a sensing apparatus 106 that may form part of the operating condition monitor 100. In the embodiments shown in FIGS. 3A and 3B the sensing apparatus 106 comprises a current sensor 120 and a voltage sensor 122 which may be used to provide a source of data to obtain the measurement of the turn-off transient energy of the power converter 102. The current sensor 120 may be configured to measure a turn-off transient current of the power converter 102. The voltage sensor 122 may be configured to measure a turn-off transient voltage of the power converter 102.

In the embodiment of FIG. 3A the sensing apparatus 106 is arranged to measure the turn-off transient current and voltage of one or more of the separate power devices (e.g. transistors 117a-117f) of the power converter 102. It may therefore be used with the embodiment shown in FIG. 2A.

The current sensor 120 comprises a Rogowski coil 121. The Rogowski coil 121 is clamped around the output of one of the phase legs of the power converter. The Rogowski coil 121 is formed from a helical coil of wire with the lead from one end returning through the centre of the coil to the other end, so that both terminals are at the same end of the coil. The voltage sensor 122 comprises a Miller capacitor 123 coupled between the base and collector of the transistor being monitored. Additional Miller capacitors and Rogowski coils may be provided to monitor each of the power devices and phase leg outputs as described above.

The transient current of each phase leg measured by the Rogowski coil 121 is fed to a controller 134. The controller is arranged to extract each power device 117a-117f transient current using a power device current re-construction approach. The transient current measurement for each power device 117a-117f may be found using the following expression:

$$\begin{bmatrix} i_{c1} \\ i_{c2} \\ i_{c3} \\ i_{c4} \\ i_{c5} \\ i_{c6} \end{bmatrix} = \frac{1}{2} \begin{bmatrix} (1+\text{sign})S_1 & 0 & 0 \\ 0 & (1+\text{sign})S_2 & 0 \\ 0 & 0 & (1+\text{sign})S_3 \\ (1-\text{sign})S_4 & 0 & 0 \\ 0 & (1-\text{sign})S_5 & 0 \\ 0 & 0 & (1-\text{sign})S_6 \end{bmatrix} * \begin{bmatrix} I_A \\ I_B \\ I_C \end{bmatrix}$$  [Equation 1]

in which:
$i_{c1}$ to $i_{c6}$ represent each power device 117a-117f current;
$S_1$ to $S_2$ represent each power device 117a-117f gate pulse,
$I_A$, $I_B$ and $I_C$ represent each phase leg 120a, 120b, 120c current.

The sensing apparatus 106 shown in FIG. 3A is configured to measure the transient voltage and current of each power device (e.g. each transistor) in one phase leg of the power converter. Further sensing apparatuses similar to that of FIG. 3A can be provided to measure the transient voltage and current of the power devices in other phase legs of the power converter.

The sensing apparatus shown in FIG. 3B operates in a similar manner to that of FIG. 3A. Corresponding components have been labelled accordingly.

The current sensor 120 of the embodiment shown in FIG. 3B similarly comprises a Rogowski coil 121. The Rogowski coil 121 may comprise a coil clamped to each phase leg of the power converter to provide a measurement of the turn-off transient current.

The voltage sensor 122 comprises a collector capacitor 123' to provide a measurement of the turn-off transient voltage. The collector capacitor 123' may be coupled to one of the phase legs of the power converter as described above in connection with FIG. 2B. The external collector capacitor may be a very small range capacitor with high voltage blocking capacity.

In both of the embodiments shown in FIGS. 3A and 3B the current sensor 120 and the voltage sensor 122 at least partly form an external sub-system connected to the power converter 102. By using additional external components to those of the power converter 102 to measure the transient voltage and current any disruption to the operation of the power converter can be minimised. This may also allow the operating condition monitor to be used more easily with an off-the-shelf power converter. The current and voltage sensors shown in FIGS. 3A and 3B are however only one example and other types of sensor may be used.

Figure 4:
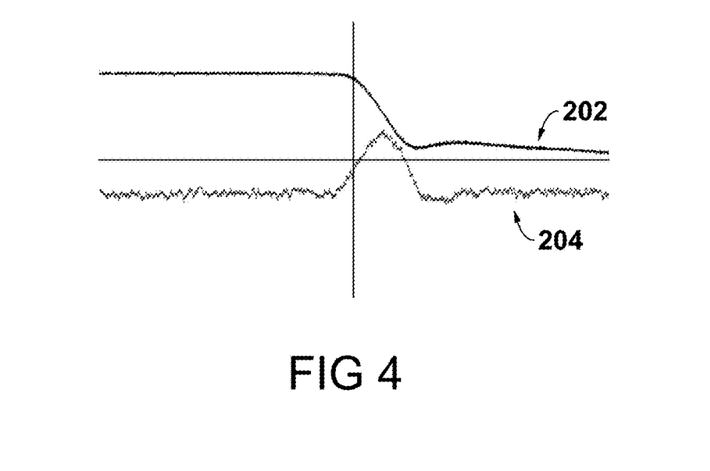
FIG. 4 is a plot of power converter turn-off current and measured transient turn-off current.

An example of the power converter turn-off current and measured transient turn-off current is shown in FIG. 4, which shows a plot of current against time during switching of the power converter. Data set 202 of FIG. 4 shows the current being switched and data set 204 shows the measured turn-off transient current. In this example, the turn-off transient current is measured using a Rogowski coil as described above.

Figure 5:
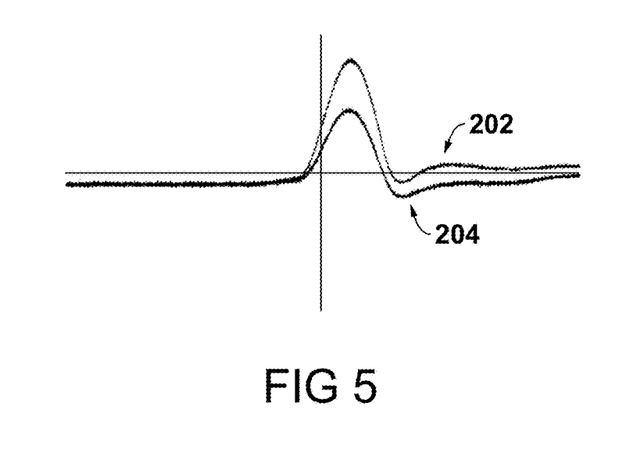
FIG. 5 is a plot of power converter turn-off voltage and measured transient turn-off voltage.

An example of power converter turn-off voltage and measured transient turn-off voltage is shown in FIG. 5. This Figure shows a plot of voltage against time during switching of the power converter. Data set 206 of FIG. 5 shows the voltage being switched and data set 208 shows the measured turn-off transient voltage. In this example, the turn-off transient voltage is measured using a collector capacitor as described above.

In the embodiments shown in FIGS. 3A and 3B, the sensing apparatus 106 further comprises a multiplier circuit 124 configured to multiply the measurement of the turn-off transient current and the measurement of the turn-off transient voltage to obtain a measurement of the turn-off transient power. The multiplier circuit may be any suitable multiplier circuit. It may, for example, be any suitable multiplier circuit with high bandwidth and signal to noise ratio.

The sensor apparatus 106 further comprises an integrator circuit 126 configured to integrate the measurement of the turn-off transient power to obtain the measurement of the turn-off transient energy. The integrator circuit 126 may be any suitable integrator circuit e.g. having high band width and signal to noise ratio.

The sensor apparatus may further comprise analogue isolation circuits 128a, 128b to isolate the multiplier circuit 126 from the voltage and current sensors 120, 122. In this way, a measurement of the transient voltage and current may be obtained and communicated to the multiplier circuit, rather than the transient voltage and current themselves. The measurement of the transient voltage and the transient current is therefore a signal indicative of the transient switching voltage and transient switching current. In other embodiments, other types of isolator may be used, or the isolators may be absent.

In some embodiments, the operating condition monitor 100 comprises a signal amplifier or gain loop configured to amplify the transient turn-off current and/or voltage measured by the voltage and current sensors. This may allow a measurement of the actual transient turn-off current and/or voltage of the power device or phase leg to be obtained from the signals measured by the voltage and current sensors. A linear amplification factor may be applied by the signal amplifier. The output of the current and voltage sensors may be small compared to the actual transient turn-off current and voltage. For example, an actual transient turn-off voltage of the order of 100 V may result in a signal measured by the voltage sensor of the order of 10 mV. A gain of 100,000 may therefore be applied to obtain the actual transient turn-off voltage. A similar gain factor may also be applied to the signal measured by the current sensor.

In some embodiments, the power converter 102 may be switched at fast frequencies in a range between a frequency of the order a hertz to a frequency of the order of a megahertz based on the particular implementation or power level. The amount of measurement data from the current sensor 120 and the voltage sensor 122 may therefore be large in the case of high frequency operation and so may be difficult manage. By using the multiplier circuit 124 and integrator circuit 126 the amount of data sent to the processor for further processing may be reduced.

Figure 6:
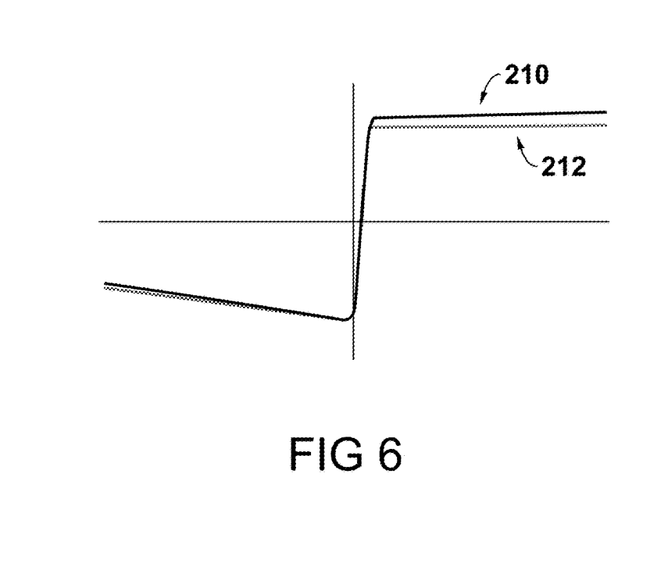
FIG. 6 is a plot of turn-off transient energy for a degraded and a non-degraded power converter.

An example of the turn-off transient energy obtained using the sensing apparatus 106 is shown in FIG. 6, which shows an example of the output of the integrator circuit 126 of the embodiment shown in FIG. 4. Data set 210 of FIG. 6 corresponds to the measured turn-off transient energy of a degraded power converter. Data set 212 corresponds to the measured turn-off transient energy of a new power converter which is known not to have any degradation. As can be seen FIG. 6, there is a difference between the turn-off transient energy of the new and degraded devices which can be used to detect the presence of the degradation.

Figure 7:
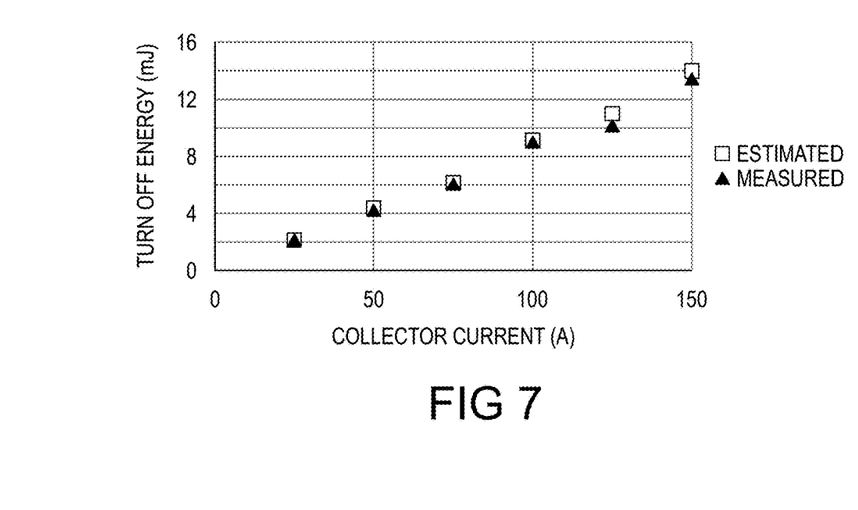
FIG. 7 shows a comparison of measured turn-off transient energy and expected turn-off transient energy.

FIG. 7 shows a comparison of the turn-off switching energy measured using a condition monitor according to an embodiment of the application and values taken from the power converter specification sheet. In this example, a SKM150GB 12T4G module produced by Semikron International GmbH of Nuremberg, Germany has been chosen. It can be observed that the measurement method of this application follows the same pattern as the datasheet values, with the maximum estimation error of approximately 0.25 percent and 0.5 percent respectively.

Figure 8:
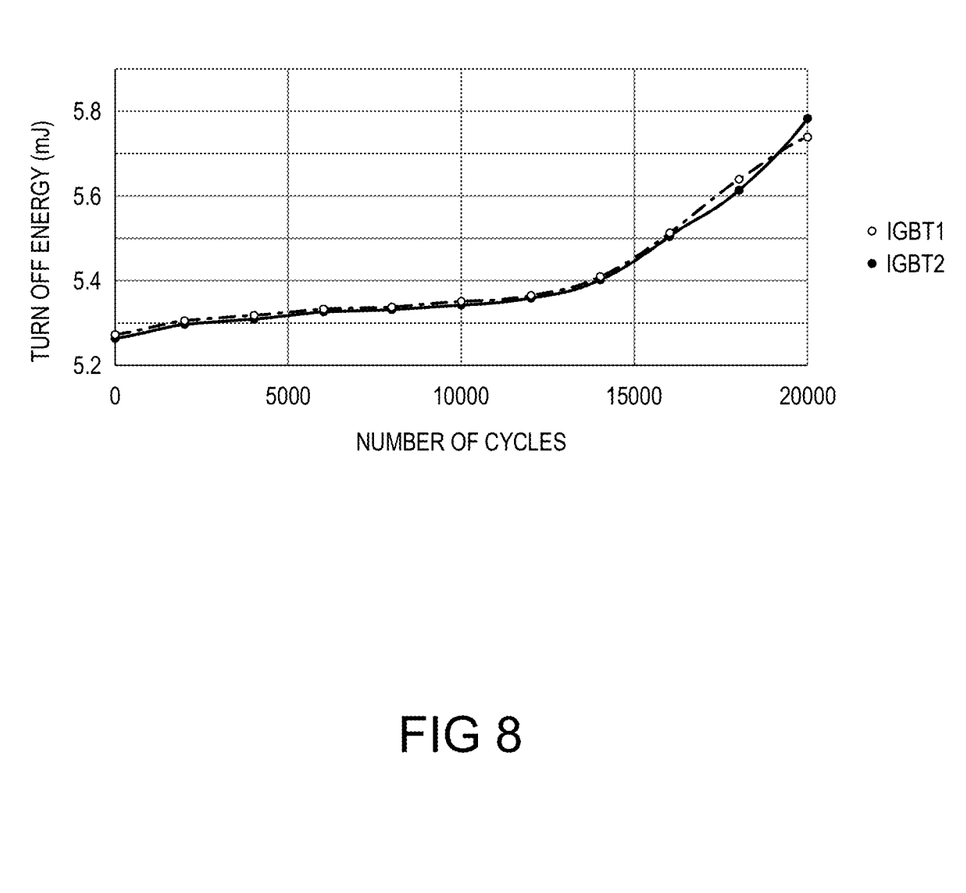
FIG. 8 is a plot of turn-off transient energy over a period of operation of a power converter.

FIG. 8 shows an example of the variation in the turn-off transient energy over a period of operation of a power converter. In FIG. 8, the turn-off transient energy is plotted against the number of switching cycles performed by the power converter to show how the turn-off transient energy changes with the age of the device. FIG. 8 shows that at low numbers of switching cycles the turn-off switching energy shows some small changes. At about 10000 cycles there is a significant change in the measured turn-off transient energy.

Figure 9:
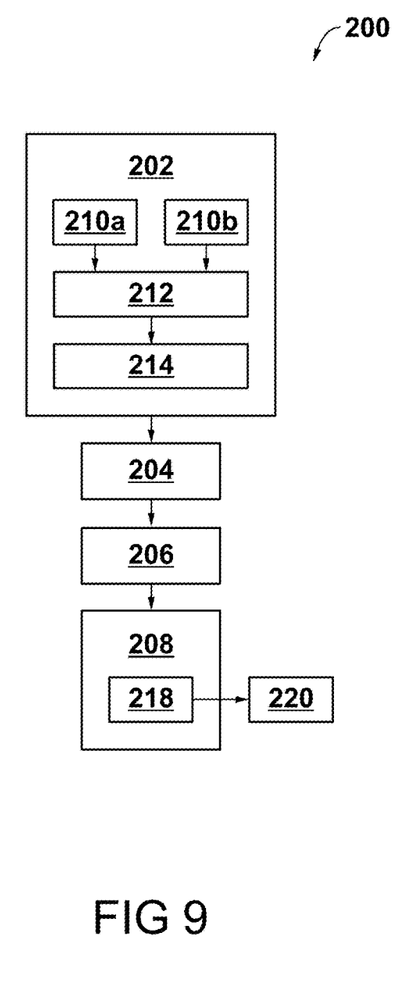
FIG. 9 shows an embodiment of a method of monitoring an operating condition of a transistor-based power converter.

A method 200 of monitoring the operating condition of a transistor-based power converter is illustrated in FIG. 9. The method 200 may, for example, be performed by the operating condition monitor 100 shown in FIG. 2A.

The method 200 comprises measuring 202 a turn-off transient energy of the power conversion device. Once the turn-off transient energy has been measured, the method 200 further comprises normalising 204 the measurement of the turn-off transient energy. The measurement of the turn-off transient energy may be normalised with respect to an operating parameter of the power converter to obtain a normalised measurement of the turn-off transient energy as described above. The method further comprises comparing 206 the normalised measurement of the turn-off transient energy to a threshold and issuing 208 an event signal based on the comparison meeting a comparison criterion.

The step 202 of measuring the turn-off transient energy may comprise: measuring 210a a turn-off transient current of one or more power devices 116a-116f (e.g. transistors) of the power converter. The turn-off transient current for each power device may be obtained using the controller device current re-construction approach described above. The measuring step 202 may therefore comprise measuring each phase leg 120a, 120b, 120c current and reconstructing the turn-off transient current for one or more of the power devices 117a-117f. The measurement step 202 further comprises measuring 210b a turn-off transient voltage of one or more of the power devices 117a-117f (e.g. transistors shown in FIGS. 2A and 2B). The steps of measuring the turn-off transient current and voltage may be performed simultaneously during operation of the power converter to provide real time monitoring.

The turn-off transient current may be measured 210a using one or more Rogowski coils. The turn-off transient voltage may be measured 210b using one or more Miller capacitors. As discussed above, the use of the Rogowski coil along with the device current re-construction approach and/or the Miller capacitors may allow measurement of the turn-off transient current and voltage whilst minimising any effect on the operation of the power converter. By measuring the voltage and current using external components to the power converter the method 200 may be used with an off-the-shelf power converter. Other types of sensor may however be used to measure the turn-off transient current and/or voltage.

Following measurement of the turn-off transient voltage and current, the method comprises multiplying 212 the measurement of the turn-off transient current and the measurement of the turn-off transient voltage to obtain a measurement of the turn-off transient power of the power devices. Once the turn-off transient power measurement has been obtained in this way, the method 200 further comprises integrating 214 the measurement of the turn-off transient power to obtain a measurement of the turn-off transient energy.

A suitable operating parameter may be used for the normalisation performed in step 204. In one embodiment, the operating parameter may be a junction temperature of one or more of the transistors provided in the power converter. Other operating parameters such as the operating current and/or the operating voltage may additionally or alternatively be used in the normalisation step 204.

The step of comparing 206 the normalised measurement of the turn-off transient energy to a threshold may comprise comparing the measurement of the normalised turn-off transient energy to a stored reference value. As discussed above, the stored reference value may be stored in a look up table. The stored reference value may be a previous measurement of the turn-off transient energy. In that case, the method 200 may further comprise recording a historical record of measured (and normalised or non-normalised) turn-off transient energy values to create the look-up table. In other embodiments, the look-up table may include reference values determined using a model or simulation of a non-degraded power converter.

The method 200 further comprises issuing 208 an event signal based on a comparison of the normalised measurement of the turn-off transient energy to a threshold. Issuing the event signal may comprise outputting 218 the event signal to a controller of the power converter for the controller to modify 220 an operating parameter of the power converter based on the event signal. In other embodiments, the event signal may be issued to any other device or output display to provide an indication of the condition of the power converter being monitored.

Figure 10:
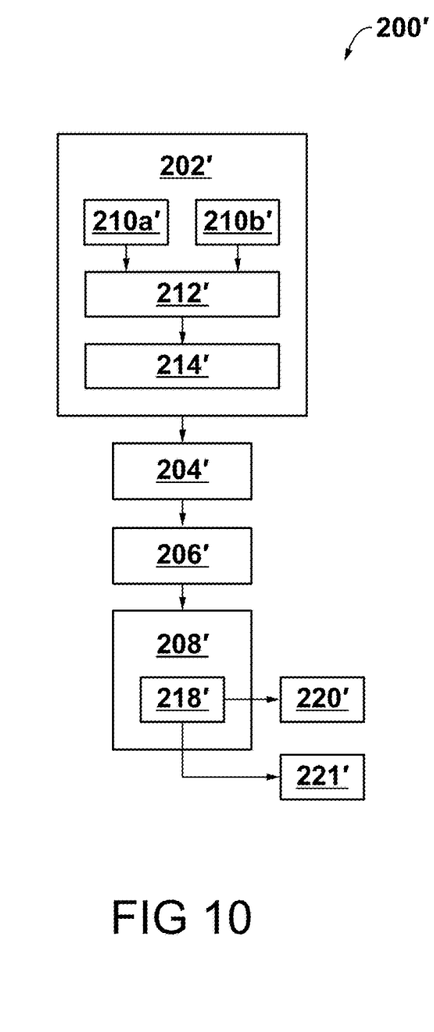
FIG. 10 shows another embodiment of a method of monitoring an operating condition of a transistor-based power converter.

Rather than using the "each power device" monitoring approach of the operating condition monitor of FIG. 2A, an "each phase leg" monitoring approach may be implemented using the operating condition monitor of FIG. 2B. A method 200' according to such an embodiment is illustrated in FIG. 10. In this embodiment, the measurement of the transient turn-off energy of one or more of the phase legs provided in the power converter may be determined separately. The embodiment of FIG. 10 includes corresponding steps to that of FIG. 9, and which have been labelled accordingly.

In the embodiment shown in FIG. 10, measuring 202' the turn-off transient energy of the power converter may comprise measuring 202' the turn-off transient energy of each of a plurality of parts of the power converter, in this case each of the phase legs shown in FIGS. 2A and 2B. The step of normalising 204' the measurement of the turn-off transient energy may comprise normalising 204' the measurement of the turn-off transient energy of each of the plurality of phase legs with respect to an operating parameter of that respective phase leg, or of the overall power converter itself. The normalisation step 204' may therefore obtain a normalised measurement of the turn-off transient energy for each of the plurality of phase legs. The measurement of the turn-off transient energy for each phase leg may be carried out by measuring 210b' the turn off-transient voltage and measuring 210a' the turn-off transient current for each of the phase legs, and multiplying 212' and integrating 214' the resulting measurement of the transient voltage and current for each phase leg to obtain the measurement of the transient turn-off energy for each of the phase legs.

In the embodiment of FIG. 10, comparing the normalised measurement of the turn-off transient energy to the threshold comprises performing a comparison 206' of the normalised measurement of the turn-off transient energy of one of the phase legs to the normalised measurement of the turn-off transient energy of another of the phase legs. Alternatively, the comparison may comprise performing a comparison 206' of the normalised measurement of the turn-off transient energy of one of the phase legs to an average normalised measurement of the turn-off transient energy of the plurality of phase legs.

The method 200 may further comprise identifying 222' one of the plurality of phase legs having the greatest deviation from the threshold. This may allow the weakest one of the plurality of phase legs to be identified. In this embodiment, issuing 208' the event indicator may comprise outputting 218' the event indicator to a controller of the power converter. The event indicator may include an identifier to identify the phase legs with the greatest deviation from average. The method may further comprise modifying 220' an operating parameter of the phase leg identified as the weakest. The operating parameter modified may include the load current and/or load voltage. Other operating parameters however may be modified. The method may comprise activating 221' a redundant back-up part of the power converter to replace the identified weakest part.

In the embodiment shown in FIG. 9, the method 200 comprises comparing the measurement of the normalised turn-off transient energy to a stored reference value. The measurement of the turn-off transient energy of one of the power devices may however be compared to a measurement of the normalised turn-off transient energy of another one of the other power devices 117a-117f, or an average of the transient turn-off energy measured for each of them (i.e. similarly to the method 200' of FIG. 10).

In the embodiment shown in FIG. 10, the method 200' comprises comparing the normalised measurement of the turn-off transient energy of one of the phase legs to the normalised measurement of the turn-off transient energy of another of the phase legs (or an average of the phase legs). The measurement of the turn-off transient energy may however be compared to a reference value (i.e. similarly to the method 200 of FIG. 9).

In either of the embodiments of FIGS. 9 and 10 the normalisation step 204, 204' may be omitted. For example, where the transient turn-off energy of different parts of the power converter are compared to each other the normalisation may not be required as discussed above.

The operating condition monitor and method of monitoring an operating condition described herein may find application in a number of different fields where the monitoring of a transistor-based power converter is required. This may include starter generators, electric drives and hybrid propulsion converters. Other applications will be apparent to the skilled person.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. An operating condition monitor for monitoring an operating condition of a transistor-based power converter, comprising:
    a sensing apparatus configured to measure a turn-off transient energy of the transistor-based power converter and
    a processor in communication with the sensing apparatus to receive the measurement of the turn-off transient energy, the processor being configured to:
    compare the measurement of the turn-off transient energy to a threshold; and issue a signal indicating degradation of the transistor-based power converter based on the comparison to the threshold meeting a comparison criterion.

2. The operating condition monitor of claim 1, wherein the sensing apparatus comprises:
    a current sensor configured to measure a turn-off transient current of the power converter;
    a voltage sensor configured to measure a turn-off transient voltage of the power converter;
    a multiplier circuit configured to multiply the measurement of the turn-off transient current and the measurement of the turn-off transient voltage to obtain a measurement of the turn-off transient power; and
    an integrator circuit configured to integrate the measurement of the turn-off transient power to obtain the measurement of the turn-off transient energy.

3. The operating condition monitor of claim 2, wherein the current sensor comprises a Rogowski coil.

4. The operating condition monitor of claim 2, wherein the voltage sensor comprises a capacitor, and optionally either:
    a) the sensing apparatus is arranged to measure the turn-off transient voltage of one or more power devices provided in the power converter, and the voltage sensor comprises one or more respective Miller capacitors arranged to measure the turn-off transient voltage of the one or more power devices; or
    b) the sensing apparatus is arranged to measure the turn-off transient voltage of one or more phase legs of the power converter, and the voltage sensor comprises one or more respective collector capacitors arranged to measure the turn-off transient voltage of the one or more phase legs.

5. The operating condition monitor of claim 1, wherein the sensing apparatus is configured to:
    measure the turn-off transient energy of the power converter by measuring the turn-off transient energy of each of a plurality of parts of the power converter and the processor may be configured to compare the measurement of the turn-off transient energy of one of the parts to the threshold;
    and wherein the processor is optionally configured to:

normalise the measurement of the turn-off transient energy by normalising the measurement of the turn-off transient energy of each of the plurality of parts of the power converter with respect to an operating parameter of each respective part of the power converter, or the overall power converter, to obtain a normalised measurement of the turn-off transient energy for each part of the power converter.

6. The operating condition monitor of claim 5, wherein the threshold is:
a measurement of the turn-off transient energy of another of the plurality of parts of the power converter; and/or
an average of the measurement of the turn-off transient energy of each of the plurality of parts of the power converter.

7. The operating condition monitor of claim 6, wherein the processor is further configured to identify one of the plurality of parts of the power converter having the greatest deviation from the threshold and optionally wherein the event signal indicates the identified part of the power converter and/or the processor is configured to output a control signal to modify an operating parameter of the identified part of the power converter.

8. The operating condition monitor of claim 1, wherein the processor is configured to:
obtain a normalised measurement of the turn-off transient energy by normalising the measurement of the turn-off transient energy with respect to an operating parameter of the power converter and wherein the measurement of the turn-off transient energy compared to the threshold is the normalised measurement; and optionally:
wherein the operating parameter is based on a junction temperature of a transistor provided in the power converter.

9. The operating condition monitor of claim 1, wherein the threshold is a stored reference value.

10. The operating condition monitor of claim 1 wherein the processor is arranged to output the signal to a controller of the power converter for the controller to modify an operating parameter of the power converter based on the signal, and optionally wherein the controller is configured to activate a redundant part or circuit of the power converter.

11. A method of monitoring an operating state of a transistor-based power converter, comprising:
measuring a turn-off transient energy of the transistor-based power converter;
comparing the measurement of the turn-off transient energy to a threshold;
issuing signal indicating degradation of the transistor-based power converter based on the comparison meeting a comparison criterion.

12. The method of claim 11, wherein measuring the turn-off transient energy of the power converter comprises:
measuring a turn-off transient current of the power converter;
measuring a turn-off transient voltage of the power converter;
multiplying the measurement of the turn-off transient current and the measurement of the turn-off transient voltage to obtain a measurement of the turn-off transient power;
integrating the measurement of the turn-off transient power to obtain the measurement of the turn-off transient energy.

13. The method of claim 12, wherein the turn-off transient current is measured using a Rogowski coil.

14. The method of claim 12, wherein the turn-off transient voltage is measured using a capacitor, and optionally either:
a) the turn-off transient voltage of one or more power devices provided in the power converter is measured using one or more respective Miller capacitors arranged to measure the turn-off transient voltage of the one or more power devices; or
b) the turn-off transient voltage of one or more phase legs of the power converter is measured using one or more respective collector capacitors arranged to measure the turn-off transient voltage of the one or more phase legs.

15. The method of claim 11, wherein the power converter comprises a plurality of parts, and wherein:
measuring the turn-off transient energy of the power converter comprises measuring the turn-off transient energy of each of the plurality of parts of the power converter; and optionally the method further comprises
normalising the measurement of the turn-off transient energy of each part of the power converter with respect to an operating parameter of that part of the power converter, or of the power converter, to obtain a normalised measurement of the turn-off transient energy for each part of the power converter.

16. The method of claim 15, wherein comparing the measurement of the turn-off transient energy to the threshold comprises:
performing a comparison of the measurement of the turn-off transient energy of one of the parts of the power converter to the measurement of the turn-off transient energy of another part of the power converter; and/or
performing a comparison of the measurement of the turn-off transient energy of one of the parts of the power converter to an average measurement of the turn-off transient energy of each of the plurality of parts of the power converter.

17. The method of claim 16, further comprising identifying one of the plurality of parts of the power converter having the greatest deviation from the threshold and modifying an operating parameter of that part of the power converter, and optionally wherein the signal indicates the identified part of the power converter and/or the method comprises outputting a control signal to modify an operating parameter of the identified part of the power converter.

18. The method of claim 11, further comprising:
normalising the measurement of the turn-off transient energy with respect to an operating parameter of the power converter to obtain a normalised measurement of the turn-off transient energy, and wherein the measurement of the turn-off transient energy compared to the threshold is the normalised measurement, and optionally:
wherein the operating parameter is a junction temperature of a transistor provided in the power converter.

19. The method of claim 11, wherein comparing the measurement of the turn-off transient energy to the threshold comprises comparing the measured turn-off transient energy to a stored reference value.

20. The method of claim 11, wherein issuing the signal comprises outputting the signal to a controller of the power converter and modifying an operating parameter of the power converter based on the signal,
optionally the method further comprises activating a redundant back-up part of the power converter in response to the signal being issued.

* * * * *